(12) United States Patent
Li

(10) Patent No.: US 6,306,775 B1
(45) Date of Patent: Oct. 23, 2001

(54) METHODS OF SELECTIVELY ETCHING POLYSILICON RELATIVE TO AT LEAST ONE OF DEPOSITED OXIDE, THERMALLY GROWN OXIDE AND NITRIDE, AND METHODS OF SELECTIVELY ETCHING POLYSILICON RELATIVE TO BPSG

(75) Inventor: Andrew Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/599,143

(22) Filed: Jun. 21, 2000

(51) Int. Cl.$^7$ ........................................... H01L 21/00
(52) U.S. Cl. .................. 438/753; 216/2; 216/99; 252/79.3; 252/79.4; 438/745
(58) Field of Search .................. 438/745, 753, 438/756, 757; 216/2, 83, 99; 252/79.2, 79.3, 79.4

(56) References Cited

U.S. PATENT DOCUMENTS 5,071,510 * 12/1991 Findler et al. .................. 438/753 X
6,083,849 * 7/2000 Ping et al. ...................... 438/753
6,261,964 * 7/2001 Wu et al. ...................... 438/753 X

* cited by examiner

Primary Examiner—William A. Powell
(74) Attorney, Agent, or Firm—Wells, St. John, Roberts, Gregory & Matkin, P.S.

(57) ABSTRACT

The invention includes methods of selectively etching polysilicon relative to at least one of deposited oxide, thermally grown oxide and nitride, and methods of selectively etching polysilicon relative to BPSG. In one implementation, a method of selectively etching polysilicon relative to at least one of deposited oxide, thermally grown oxide and nitride, includes forming a substrate to have a layer comprising polysilicon received over at least one layer comprising at least one of deposited oxide, thermally grown oxide, and nitride. The polysilicon is exposed to an aqueous solution comprising $NH_4F$, an oxidizer, $CH_3COOH$, TMAH, and HF under conditions effective to selectively etch at least a portion of the polysilicon comprising layer relative to an ultimately exposed portion of the at least one of deposited oxide, thermally grown oxide, and nitride. In one implementation, the polysilicon is exposed to an aqueous solution comprising $NH_4F$, an oxidizer, $CH_3COOH$, and TMAF under conditions effective to selectively etch at least a portion of the polysilicon comprising layer relative to an ultimately exposed portion of the at least one of deposited oxide, thermally grown oxide, and nitride.

86 Claims, 9 Drawing Sheets

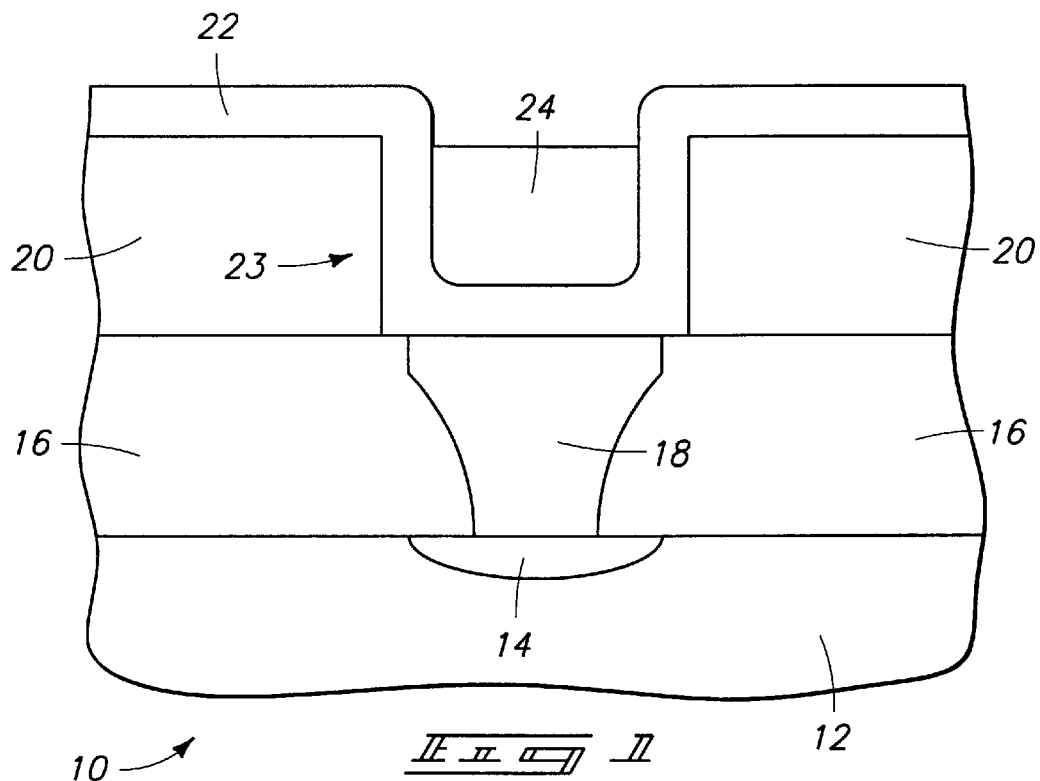
_FIG 1_
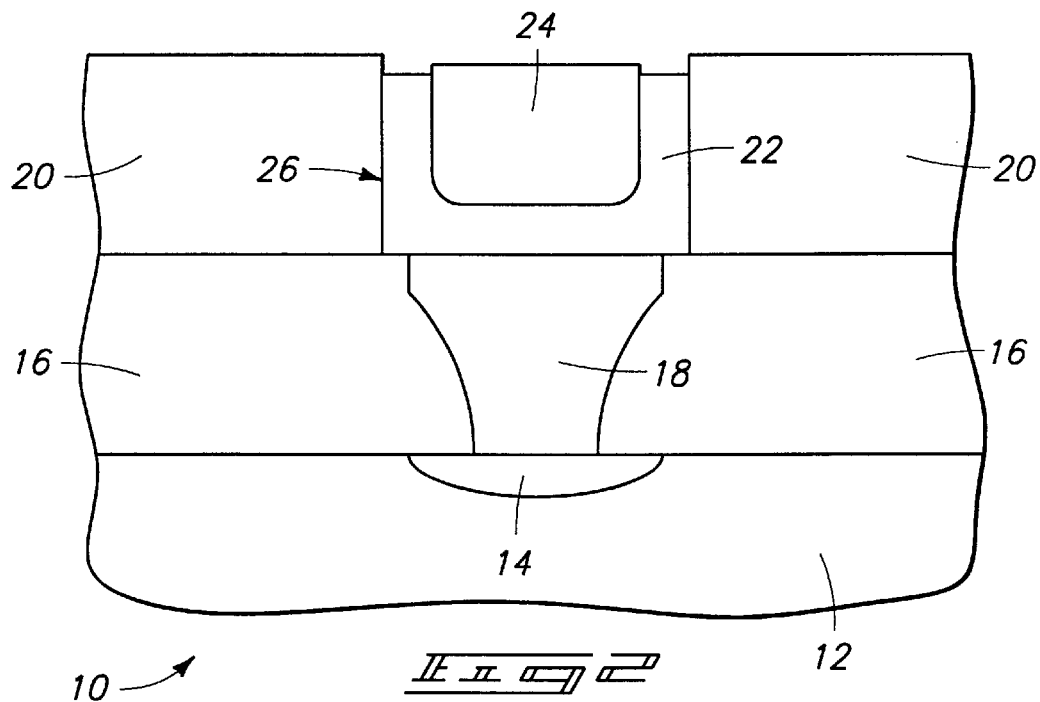
_FIG 2_

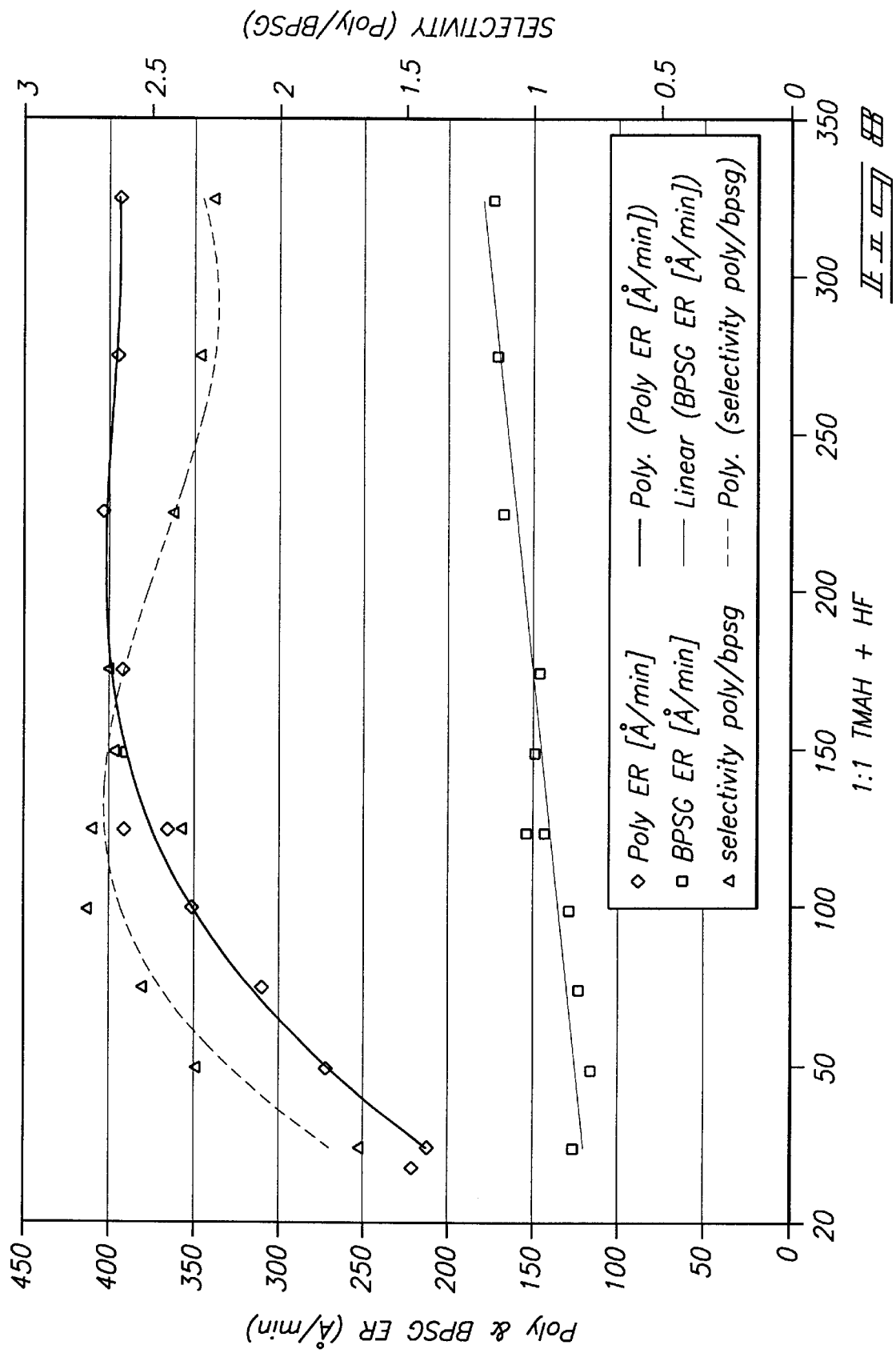

METHODS OF SELECTIVELY ETCHING POLYSILICON RELATIVE TO AT LEAST ONE OF DEPOSITED OXIDE, THERMALLY GROWN OXIDE AND NITRIDE, AND METHODS OF SELECTIVELY ETCHING POLYSILICON RELATIVE TO BPSG

TECHNICAL FIELD

This invention relates generally to methods of selectively etching polysilicon relative to at least one of deposited oxide (for example BPSG), thermally grown oxide and nitride.

BACKGROUND OF THE INVENTION

Semiconductor processing often involves the deposition of films or layers over or on a semiconductor substrate surface which may or may not have other layers already formed thereon. In typical circuitry fabrication, portions of an outer layer are masked, typically using photoresist, to provide a desired pattern over the outer layer. An underlying layer is then etched through the mask opening, with the mask covering and protecting the substantial portions of the covered portions from etching. Typically it is desired to etch the outer layer or layers selectively relative to an underlying layer. Accordingly, etch chemistry and conditions are continually being developed and improved to achieve a manner by which the desired layer can be etched while stopping and substantially not etching an underlying layer.

One common material in semiconductor processing which is desirably etched selectively relative to certain underlying material is doped and undoped polysilicon. In the context of this document, "doped polysilicon" defines a polysilicon material which is doped with a conductivity enhancing impurity to a concentration of at least $1 \times 10^{18}$ atoms/cm$^3$. Accordingly, "undoped polysilicon" in the context of this document defines a polysilicon material having less than $1 \times 10^{18}$ atoms/cm$^3$ of conductivity enhancing dopant impurity. Typical materials that polysilicon is desirably selectively etched relative to include deposited oxides, whether doped or undoped, thermally grown oxides, and nitrides, for example silicon nitride.

One etch chemistry which is useful and effective at etching polysilicon is referred to as "APE", which is also known as an ammonia peroxide etch chemistry, which comprises a combination of ammonium fluoride, hydrogen peroxide, and acetic acid. A typical prior art composition of such an aqueous solution includes a mixture having a volumetric ratio of such materials at 250:250:2.5, respectively. The NH$_4$F is however provided as a 45% aqueous solution by volume, the H$_2$O$_2$ as a 70% aqueous solution by volume, with the acetic acid being substantially 100% pure acetic acid. Accordingly, the true ratio of these components by volume in the mixture of such solutions is 112.5:175:2.5, by volume. This etching chemistry is quite effective at etching deposited polysilicon layers. However, its selectivity to deposited oxides such as borophosphosilicate glass (BPSG), is almost non-existent, meaning that such chemistry etches these materials at substantially the same rate. Accordingly, it would be desirable to develop a method for etching polysilicon substantially selective relative to deposited oxides, thermal oxides and nitrides utilizing a chemistry that includes NH$_4$F, at least one oxidizer, and acetic acid.

SUMMARY

The invention includes methods of selectively etching polysilicon relative to at least one of deposited oxide, thermally grown oxide and nitride, and methods of selectively etching polysilicon relative to BPSG. In one implementation, a method of selectively etching polysilicon relative to at least one of deposited oxide, thermally grown oxide and nitride, includes forming a substrate to have a layer comprising polysilicon received over at least one layer comprising at least one of deposited oxide, thermally grown oxide, and nitride. The polysilicon is exposed to an aqueous solution comprising NH$_4$F, an oxidizer, CH$_3$COOH, tetramethylammonium hydroxide (TMAH), and HF under conditions effective to selectively etch at least a portion of the polysilicon comprising layer relative to an ultimately exposed portion of the at least one of deposited oxide, thermally grown oxide, and nitride. In one implementation, the polysilicon is exposed to an aqueous solution comprising NH$_4$F, an oxidizer, CH$_3$COOH, and tetramethylammonium fluoride (TMAF) under conditions effective to selectively etch at least a portion of the polysilicon comprising layer relative to an ultimately exposed portion of the at least one of deposited oxide, thermally grown oxide, and nitride.

BRIEF DESCRIPTION OF THE DRAWINGS

Preferred embodiments of the invention are described below with reference to the following accompanying drawings.

FIG. 1 is a diagrammatic sectional view of a semiconductor wafer fragment in process in accordance with an aspect of the invention.

FIG. 2 is a view of the FIG. 1 wafer fragment at a processing step subsequent to that depicted by FIG. 1.

FIG. 8 is a graphical representation of reduction to practice examples in accordance with aspects of the invention.

FIG. 9 is a graphical representation of reduction to practice examples in accordance with aspects of the invention.

FIG. 10 is a graphical representation of reduction to practice examples in accordance with aspects of the invention.

DETAILED DESCRIPTION OF THE PREFERRED EMBODIMENTS

Figure 3:
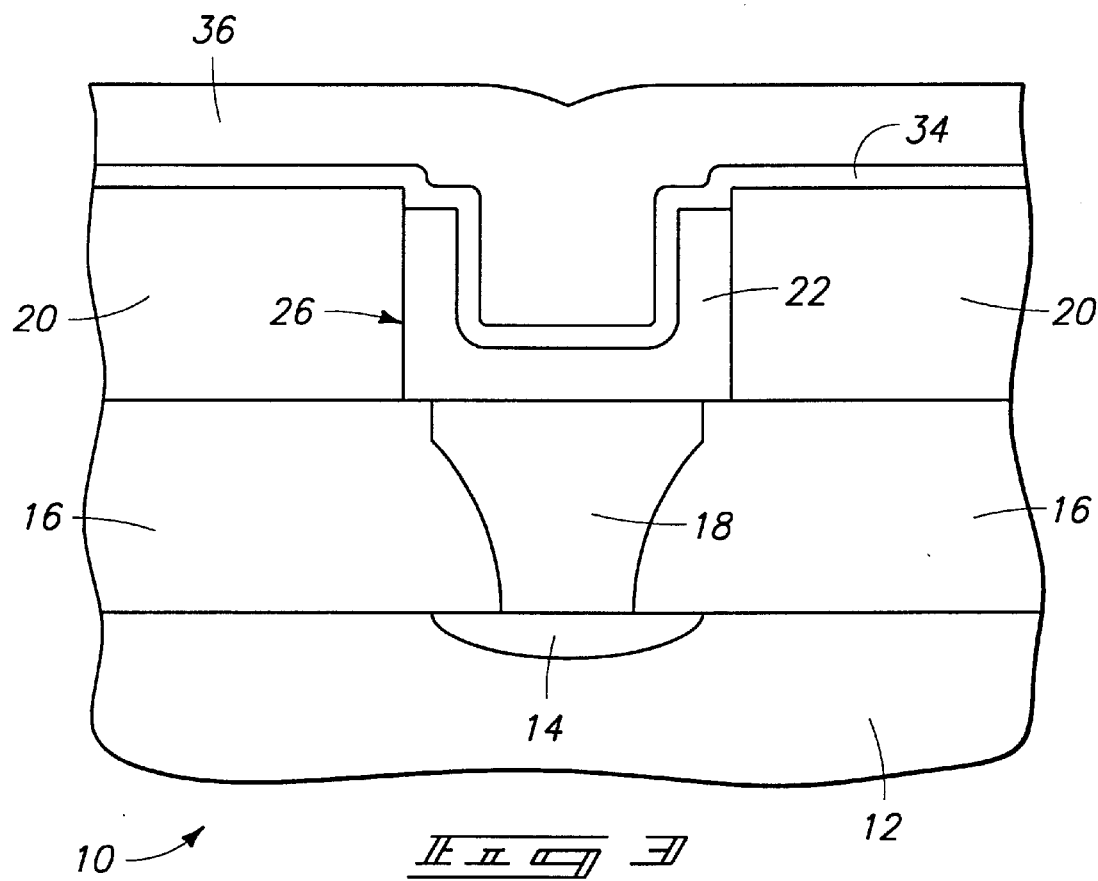
FIG. 3 is a view of the FIG. 1 wafer fragment at a processing step subsequent to that depicted by FIG. 2.

This disclosure of the invention is submitted in furtherance of the constitutional purposes of the U.S. Patent Laws "to promote the progress of science and useful arts" (Article 1, Section 8).

Referring to FIG. 1, one exemplary embodiment of a method of selectively etching polysilicon relative to at least one of deposited oxide, thermally grown oxide, and nitride is described. In the context of this document, unless otherwise indicated, "selectively" means achieving a removal ratio of one material relative to another of at least 2:1. The shown embodiment is provided for illustrative purposes only, and is in no way limiting to the method. Such merely provides an exemplary best mode embodiment. FIGS. 1–5 depict exemplary processing in fabrication of a capacitor of, for example, dynamic random access memory circuitry. FIG. 1 depicts a substrate 10 comprising a bulk monocrystalline silicon substrate 12 having a diffusion region 14 formed therein. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, "layer" includes both the singular and plural.

An insulative layer 16, such as BPSG, is formed over substrate 12, and provided with a conductive plugging material 18 therein in electrical connection with diffusion region 14. A container forming material 20 is formed over layers 16 and 18, and preferably comprises an insulative material such as a deposited oxide, with BPSG being but one example. A container opening 23 is formed within container forming material 20. A polysilicon comprising layer 22 is deposited over container forming material 20 to within opening 23 to less than completely fill opening 23. Layer 22 will ultimately comprise storage node material of a capacitor being formed, and is accordingly ultimately conductively doped. As formed and during the etching described subsequently, it may or may not be doped. A masking material 24 has been deposited over the wafer and planarized or otherwise etched back to effectively mask internal surfaces of layer 22 within container opening 23 from subsequent attack by an etching chemistry. Layer 24 in a preferred embodiment will be sacrificial, and accordingly preferably comprises any material which is restrictive to the etching chemistry to be described. The material is also preferably selectively etchable relative to container forming material 20 where such material is to remain as part of the finished circuitry. Sample materials for layer 24 include photoresist, spin-on glass, and silicon nitride. FIG. 1 depicts but one example of forming a substrate to have a layer comprising polysilicon received over at least one layer comprising at least one of deposited oxide, thermally grown oxide, and nitride.

In a first embodiment, polysilicon of layer 22 is exposed to an aqueous solution comprising $NH_4F$, an oxidizer, $CH_3COOH$, tetramethyl-ammonium hydroxide (TMAH), and HF under conditions effective to selectively etch at least portions of the polysilicon comprising layer relative to ultimately exposed portions of the at least one of deposited oxide, thermally grown oxide, and nitride. Example and preferred oxidizers include $H_2O_2$, $HNO_3$ and $O_3$. Preferably, the aqueous solution in the etching consists essentially of $NH_4F$, oxidizer, $CH_3COOH$, TMAH, and HF, and more preferably consists essentially $NH_4F$, $H_2O_2$, $CH_3COOH$, TMAH, and HF. In the depicted example of FIG. 2, container forming material 20 in the preferred embodiment in the form of deposited oxide, and even more preferred in the form of deposited oxide which is doped with at least one of boron and phosphorus, and even more preferred comprising BPSG, comprises one example of a deposited oxide which is ultimately exposed during the etch and to which the etching is conducted selectively relative thereto. Masking material 24 also constitutes an exemplary additional layer ultimately having a portion thereof exposed during the subject etching.

In the aqueous solution, the $NH_4F$, oxidizer, $CH_3COOH$, TMAH, and HF are preferably present in the solution within volumetric ranges of about 90–135: 70–280: 1.5–5.0: 0.07–0.30: 0.19–0.30, respectively. More preferably, the aqueous solution has the $NH_4F$, oxidizer, $CH_3COOH$, TMAH, and HF present in the solution within volumetric ranges of about 112–124: 105–245: 2.0–4.5: 0.120–0.228: 0.22–0.28, respectively. A specific preferred example includes an aqueous solution comprising $NH_4F$, oxidizer, $CH_3COOH$, TMAH, and HF present in the solution within volumetric ranges of about 112.5: 175: 2.5: 0.175: 0.2475, respectively.

The preferred conditions also comprise a temperature range during etching of from about 12° C. to about 32° C., and more preferably a temperature range of from about 20° C. to about 24° C. A preferred pressure is ambient room pressure. Preferably, the exposing is conducted to selectively etch the polysilicon relative to the at least one of deposited oxide, thermally grown oxide, and nitride at a ratio of at least 2.1:1, and more preferably at a ratio of at least 2.7:1. The invention was reduced to practice utilizing one example of an aqueous solution consisting of $NH_4F$, $H_2O_2$, $CH_3COOH$, TMAH, and HF. Such materials were mixed in desired ratios from the following solutions: the $NH_4F$ was 45% $NH_4F$ in water; the $H_2O_2$ was 70% $H_2O_2$ in water; the acetic acid was essentially 100% pure; the TMAH was 35% concentration in water; and the HF was about 49% to 50% concentration in water, all by volume.

Figure 6:
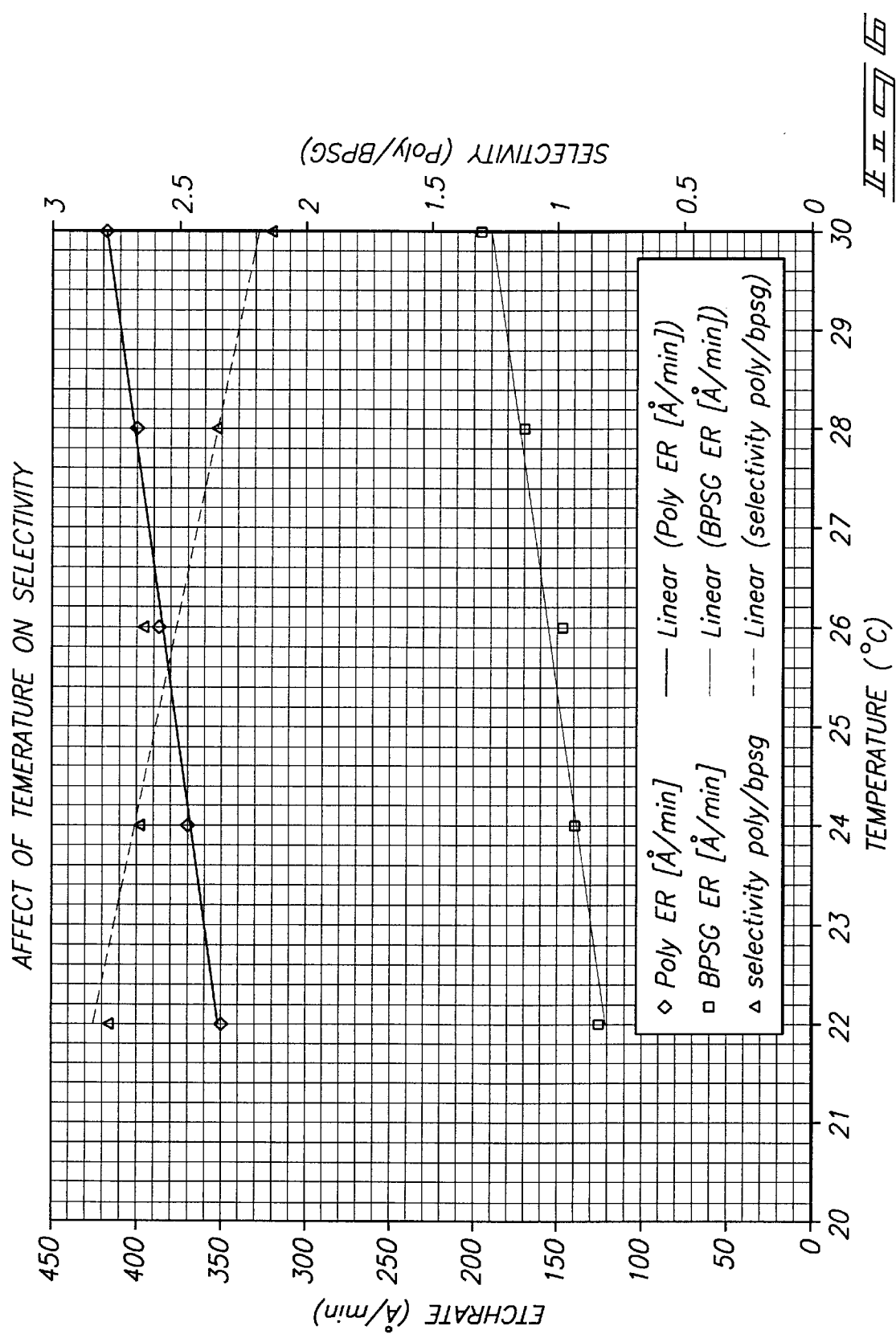
FIG. 6 is a graphical representation of reduction to practice examples in accordance with aspects of the invention.

FIG. 6 provides reduction-to-practice examples plotting etch rate and selectivity of undoped polysilicon deposited over BPSG as a function of temperature. The polysilicon had a dopant concentration of less than $1 \times 10^{18}$ atom/$cm^3$ of any conductivity enhancing impurity, if any. The same solution was utilized in all of the processing from which FIG. 6 was derived, and was $NH_4F$, $H_2O_2$, $CH_3COOH$, TMAH, and HF present in the aqueous solution in volumetric ranges of about 112.5: 175: 2.5: 0.175: 0.2475, respectively.

Figure 7:
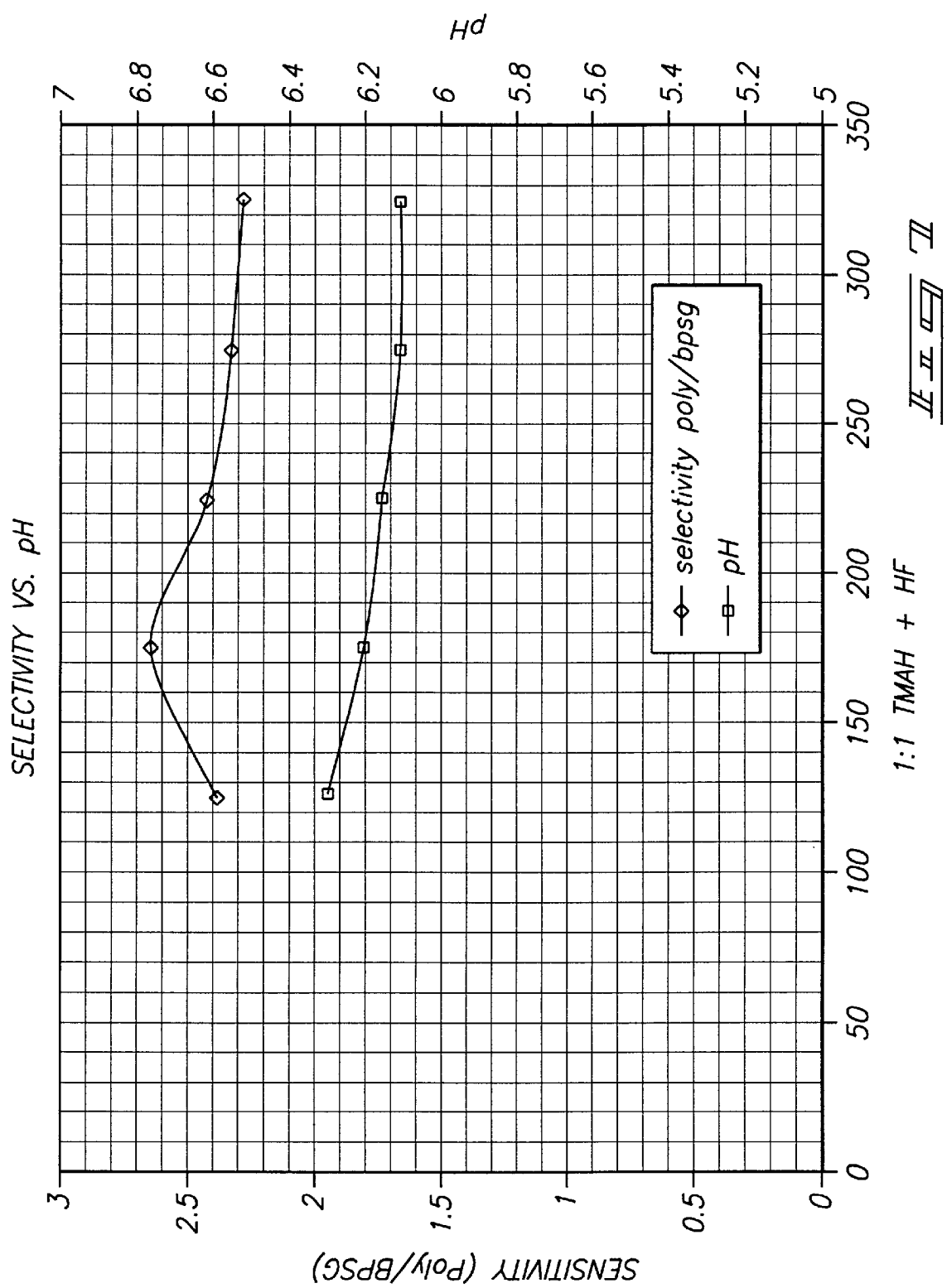
FIG. 7 is a graphical representation of reduction to practice examples in accordance with aspects of the invention.
Figure 7:
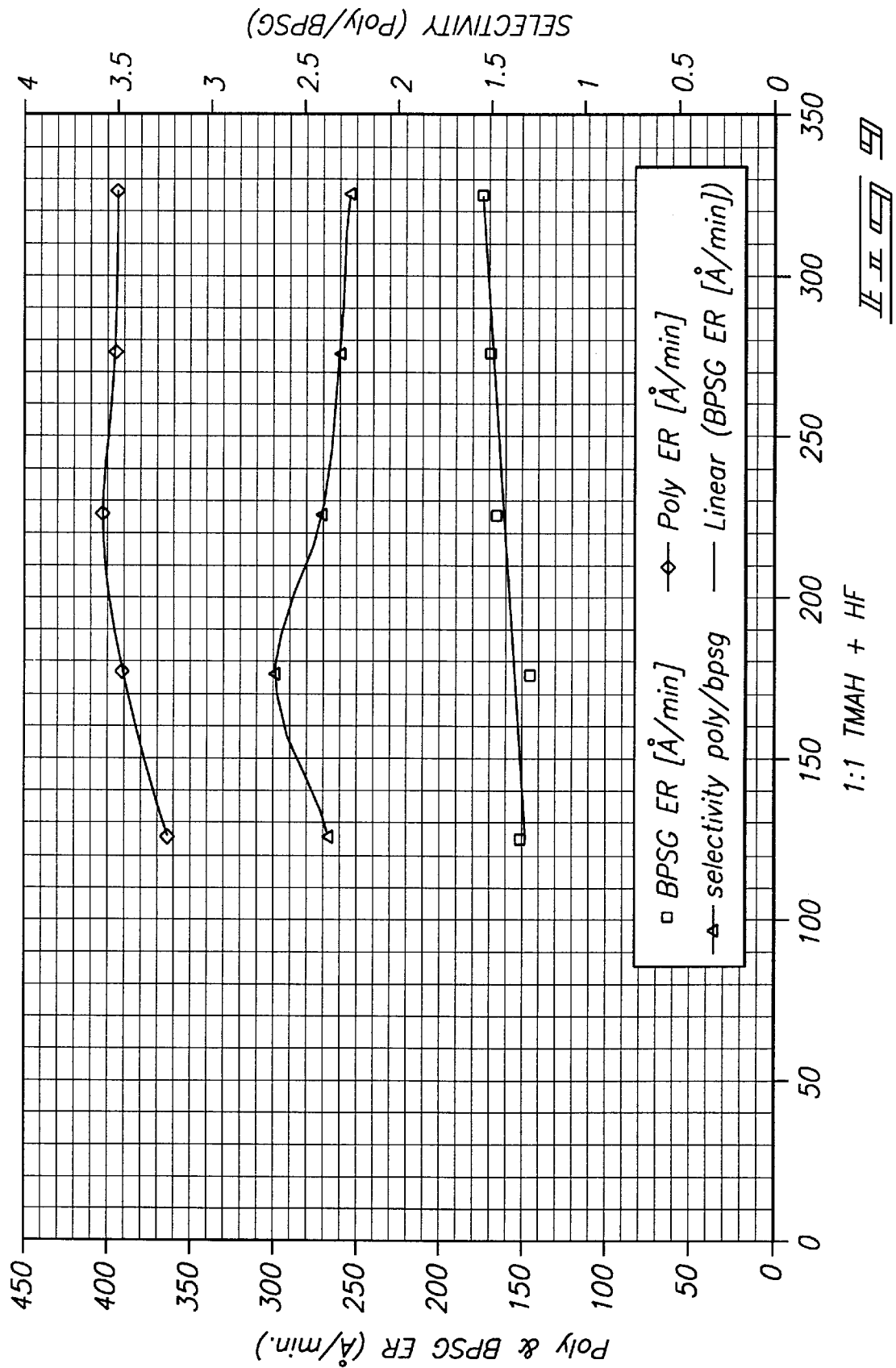
Figure 11:
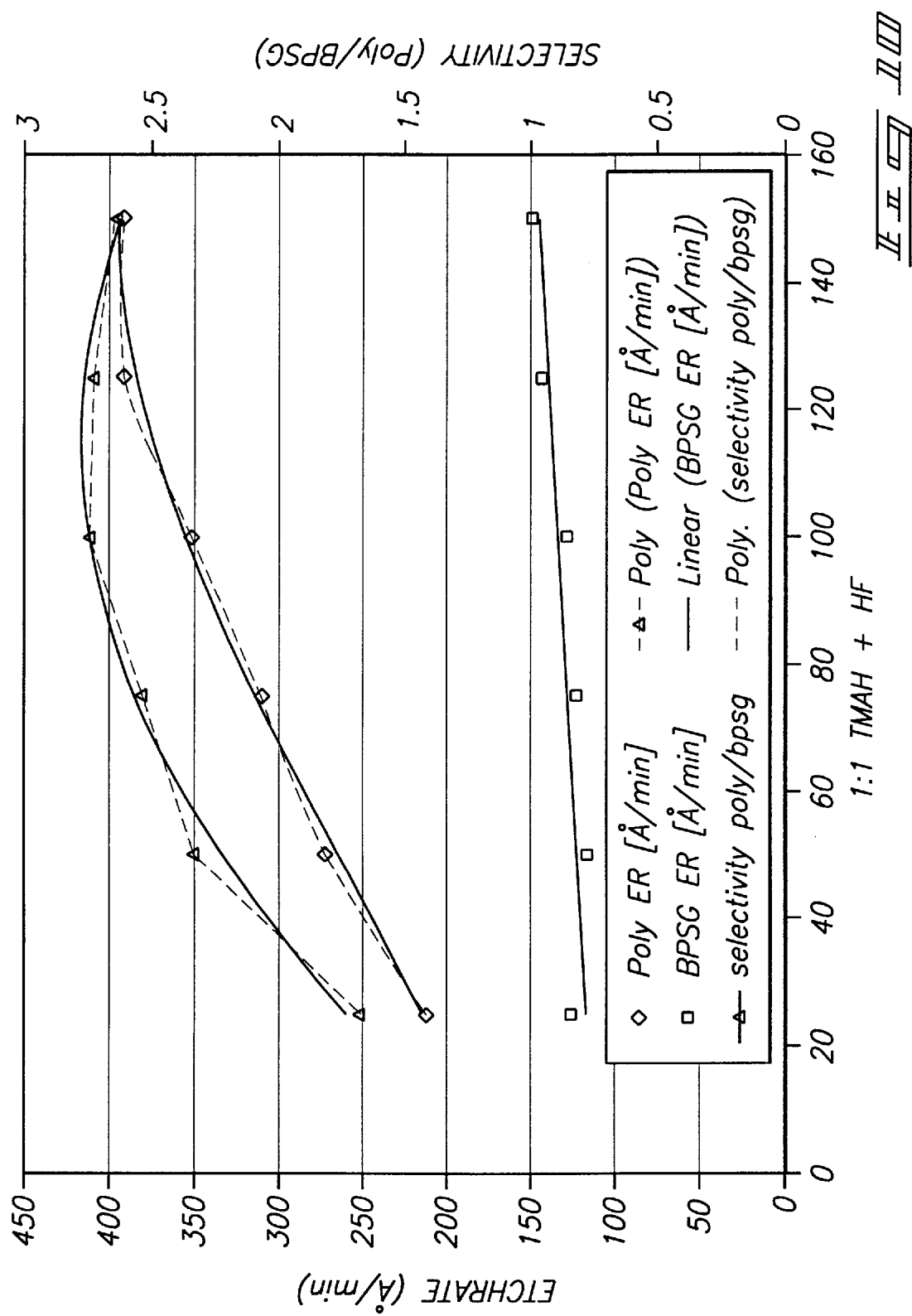

FIG. 7 illustrates exemplary embodiments conducted at 22° C. temperature of the undoped polysilicon over BPSG, depicting selectivity and pH as a function of variable additions in milliliters of 1:1 provided TMAH and HF to an etching solution comprising the above ratios of $NH_4F$, $H_2O_2$ and $CH_3COOH$ of a starting volume of 125 mL. Where, for example, the x-axis numeral says 100 milliliters, such represents 50 milliliters of 35% TMAH solution being added and 50 milliliters of 49%–50% HF solution being added.

FIG. 8 depicts undoped polysilicon and BPSG etch rate and selectivity as a function of variable TMAH and HF in the etching solution as described above with respect to FIG. 7.

FIG. 9 illustrates another exemplary reduction-to-practice run plotting alternate data in accordance with the FIG. 8 graph.

FIG. 10 illustrates another exemplary reduction-to-practice run plotting alternate data.

The invention in another implementation contemplates utilization of tetramethylammonium fluoride (TMAF) with, or more preferably as a substitute for, TMAH and HF. When substituted for TMAH and HF, the preferred aqueous etching solution has $NH_4F$, oxidizer, $CH_3COOH$, and TMAF present in solution within the volumetric ranges of about 90–135: 70–280: 1.5–5.0: 0.17–0.53, respectively. A more preferred range is $NH_4F$, oxidizer, $CH_3COOH$, and TMAF to be present in the aqueous solution within volumetric ranges of about 112–124: 105–245: 2.0–4.5: 0.26–044, respectively. A more specific example includes $NH_4F$, oxidizer, $CH_3COOH$, and TMAF present in aqueous solution within volumetric ranges of about 112.5 175: 2.5: 0.35, respectively. Etching conditions and parameters preferably otherwise include those as described above utilizing an etching chemistry including the TMAH and HF.

Figure 4:
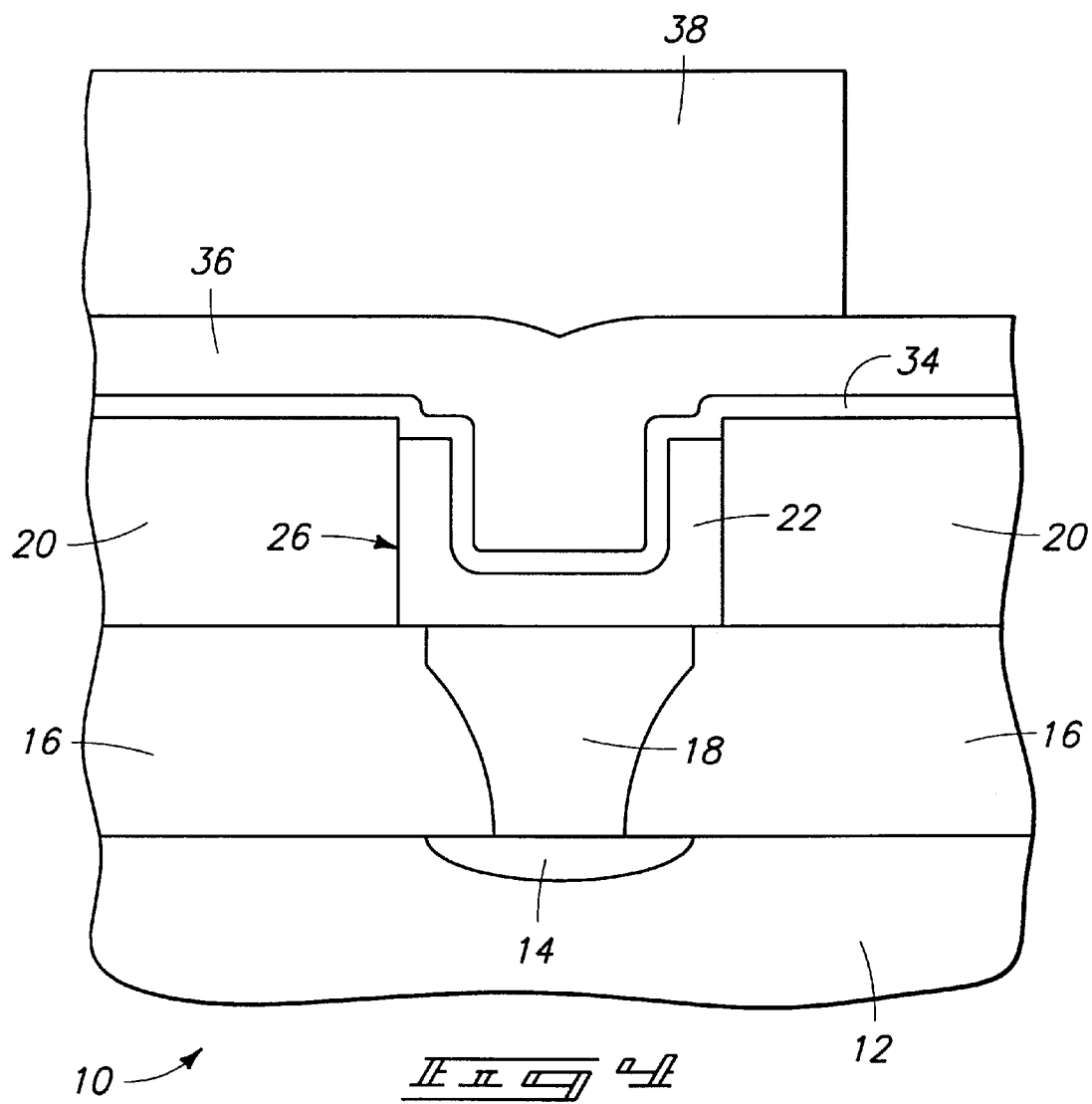
FIG. 4 is a view of the FIG. 1 wafer fragment at a processing step subsequent to that depicted by FIG. 3.

Referring to FIG. 3, masking material 24 has been removed and a capacitor dielectric layer 34 and an outer conductive capacitor electrode 36 formed as part of substrate 10. The material of capacitor electrode 36 in the described embodiment also preferably comprises polysilicon which is ultimately doped to be suitably conductive to function as a capacitor electrode. Such may or may not be so doped at this point in the process. Such layer is typically ultimately patterned. FIG. 4 illustrates such an exemplary patterning thereof, whereby a photoresist layer 38 has been deposited, masked and developed to produce the illustrated masking block over layer 36.

Figure 5:
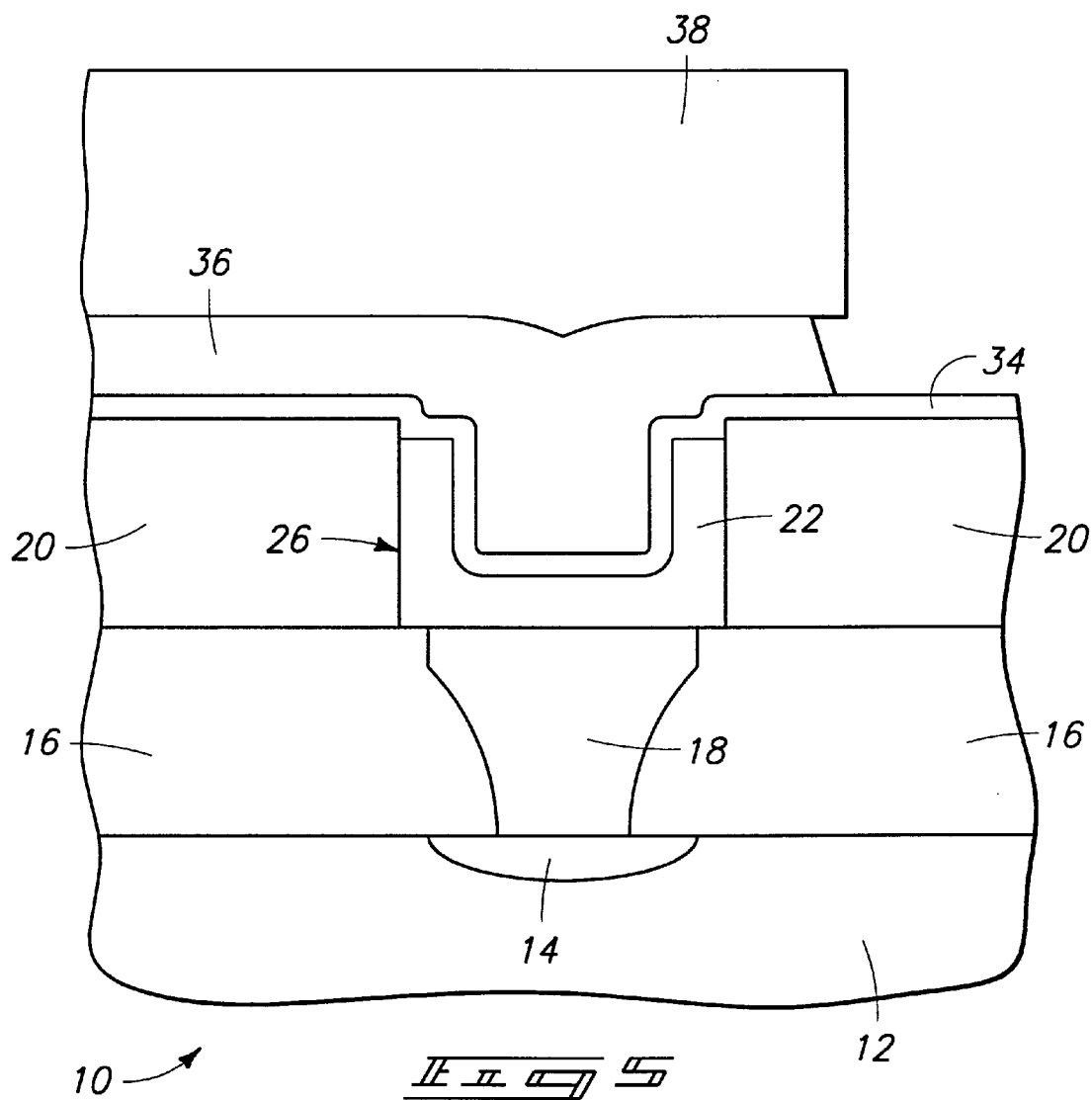
FIG. 5 is a view of the FIG. 1 wafer fragment at a processing step subsequent to that depicted by FIG. 4.

Referring to FIG. 5, polysilicon comprising layer 36 is exposed to any of the above-described aqueous solutions under conditions effective to selectively etch at least a portion thereof selectively relative to both the illustrated photoresist 38 and the capacitor dielectric layer 34 which may comprise deposited oxide thermally grown oxide, nitride or other material.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of selectively etching polysilicon relative to at least one of deposited oxide, thermally grown oxide and nitride, comprising:

forming a substrate to have a layer comprising polysilicon received over at least one layer comprising at least one of deposited oxide, thermally grown oxide, and nitride; and exposing the polysilicon to an aqueous solution comprising $NH_4F$, an oxidizer, $CH_3COOH$, TMAF, and HF under conditions effective to selectively etch at least a portion of the polysilicon comprising layer relative to an ultimately exposed portion of the at least one of deposited oxide, thermally grown oxide, and nitride.

2. The method of claim 1 wherein the at least one layer comprises deposited oxide.

3. The method of claim 1 wherein the at least one layer comprises deposited oxide which is doped with at least one of boron and phosphorus.

4. The method of claim 1 wherein the at least one layer comprises thermally grown oxide.

5. The method of claim 1 wherein the at least one layer comprises nitride.

6. The method of claim 1 wherein the $NH_4F$, oxidizer, $CH_3COOH$, TMAH, and HF are present in the solution within volumetric ranges of about 90–135: 70–280: 1.5–5.0: 0.07–0.30: 0.19–0.30, respectively.

7. The method of claim 1 wherein the $NH_4F$, oxidizer, $CH_3COOH$, TMAH, and HF are present in the solution within volumetric ranges of about 112–124: 105–245: 2.0–4.5: 0.120–0.228: 0.22–0.28, respectively.

8. The method of claim 1 wherein the $NH_4F$, oxidizer, $CH_3COOH$, TMAH, and HF are present in the solution within volumetric ranges of about 112.5: 175: 2.5: 0.175: 0.2475, respectively.

9. The method of claim 1 wherein the oxidizer comprises $H_2O_2$.

10. The method of claim 1 wherein the oxidizer comprises $HNO_3$.

11. The method of claim 1 wherein the oxidizer comprises $O_3$.

12. The method of claim 1 wherein the conditions comprise a temperature of from about 12° C. to about 32° C.

13. The method of claim 1 wherein the conditions comprise a temperature of from about 20° C. to about 24° C.

14. The method of claim 1 wherein the conditions comprise ambient pressure.

15. The method of claim 1 comprising conducting the exposing to selectively etch the polysilicon relative to the at least one of deposited oxide, thermally grown oxide, and nitride at a ratio of at least 2.5:1.

16. The method of claim 1 comprising conducting the exposing to selectively etch the polysilicon relative to the at least one of deposited oxide, thermally grown oxide, and nitride at a ratio of at least 2.7:1.

17. The method of claim 1 wherein the polysilicon is undoped.

18. The method of claim 1 wherein the polysilicon is doped.

19. The method of claim 1 wherein the aqueous solution consists essentially of $NH_4F$, oxidizer, $CH_3COOH$, TMAH, and HF.

20. The method of claim 1 wherein the aqueous solution consists essentially of $NH_4F$, $H_2O_2$, $CH_3COOH$, TMAH, and HF.

21. A method of selectively etching polysilicon relative to at least one of deposited oxide, thermally grown oxide and nitride, comprising:

forming a substrate to have a layer comprising polysilicon received over at least one layer comprising at least one of deposited oxide, thermally grown oxide, and nitride; and exposing the polysilicon to an aqueous solution comprising $NH_4F$, an oxidizer, $CH_3COOH$, and TMAF under conditions effective to is selectively etch at least a portion of the polysilicon comprising layer relative to an ultimately exposed portion of the at least one of deposited oxide, thermally grown oxide, and nitride.

22. The method of claim 21 wherein the at least one layer comprises deposited oxide.

23. The method of claim 21 wherein the at least one layer comprises deposited oxide which is doped with at least one of boron and phosphorus.

24. The method of claim 21 wherein the at least one layer comprises thermally grown oxide.

25. The method of claim 21 wherein the at least one layer comprises nitride.

26. The method of claim 21 wherein the $NH_4F$, oxidizer, $CH_3COOH$, and TMAF are present in the solution within volumetric ranges of about 90–135: 70–280: 1.5–5.0: 0.17–0.53, respectively.

27. The method of claim 21 wherein the $NH_4F$, oxidizer, $CH_3COOH$, and TMAF are present in the solution within volumetric ranges of about 112–124: 105–245: 2.0–4.5: 0.26–0.44, respectively.

28. The method of claim 21 wherein the $NH_4F$, oxidizer, $CH_3COOH$, and TMAF are present in the solution within volumetric ranges of about 112.5: 175: 2.5: 0.35, respectively.

29. The method of claim 21 wherein the oxidizer comprises $H_2O_2$.

30. The method of claim 21 wherein the oxidizer comprises $HNO_3$.

31. The method of claim 21 wherein the oxidizer comprises $O_3$.

32. The method of claim 21 wherein the conditions comprise a temperature of from about 12° C. to about 32° C.

33. The method of claim 21 wherein the conditions comprise a temperature of from about 20° C. to about 24° C.

34. The method of claim 21 wherein the conditions comprise ambient pressure.

35. The method of claim 21 comprising conducting the exposing to selectively etch the polysilicon relative to the at least one of deposited oxide, thermally grown oxide, and nitride at a ratio of at least 2.5:1.

36. The method of claim 21 comprising conducting the exposing to selectively etch the polysilicon relative to the at least one of deposited oxide, thermally grown oxide, and nitride at a ratio of at least 2.7:1.

37. The method of claim 21 wherein the polysilicon is undoped.

38. The method of claim 21 wherein the polysilicon is doped.

39. The method of claim 21 wherein the aqueous solution consists essentially of $NH_4F$, oxidizer, $CH_3COOH$, TMAF.

40. The method of claim 21 wherein the aqueous solution consists essentially of $NH_4F$, $H_2O_2$, $CH_3COOH$, TMAF.

41. A method of selectively etching polysilicon relative to BPSG comprising:

forming a substrate to have a layer comprising polysilicon received over a BPSG comprising layer; and exposing the polysilicon to an aqueous solution comprising $NH_4F$, an oxidizer, $CH_3COOH$, TMAH, and HF within volumetric ranges of about 90–135: 70–280: 1.5–5.0: 0.07–0.30: 0.19–0.30, respectively, under conditions effective to selectively etch at least a portion of the polysilicon comprising layer relative to an ultimately exposed portion of the BPSG comprising layer, the conditions comprising a temperature of from about 12° C. to about 32° C.

42. The method of claim 41 wherein the $NH_4F$, oxidizer, $CH_3COOH$, TMAH, and HF are present in the solution within volumetric ranges of about 112–124: 105–245: 2.0–4.5: 0.120–0.228: 0.22–0.28, respectively.

43. The method of claim 41 wherein the $NH_4F$, oxidizer, $CH_3COOH$, TMAH, and HF are present in the solution within volumetric ranges of about 112.5: 175: 2.5: 0.175: 0.2475, respectively.

44. The method of claim 41 wherein the oxidizer comprises $H_2O_2$.

45. The method of claim 41 wherein the oxidizer comprises $HNO_3$.

46. The method of claim 41 wherein the oxidizer comprises $O_3$.

47. The method of claim 41 wherein the conditions comprise a temperature of from about 20° C. to about 24° C.

48. The method of claim 41 comprising conducting the exposing to selectively etch the polysilicon relative to the BPSG comprising layer at a ratio of at least 2.5:1.

49. The method of claim 41 comprising conducting the exposing to selectively etch the polysilicon relative to the BPSG comprising layer at a ratio of at least 2.7:1.

50. The method of claim 41 wherein the polysilicon is undoped.

51. The method of claim 41 wherein the polysilicon is doped.

52. The method of claim 41 wherein the aqueous solution consists essentially of $NH_4F$, oxidizer, $CH_3COOH$, TMAH, and HF.

53. The method of claim 41 wherein the aqueous solution consists essentially of $NH_4F$, $H_2O_2$, $CH_3COOH$, TMAH, and HF.

54. A method of selectively etching polysilicon relative to BPSG comprising:

forming a substrate to have a layer comprising polysilicon received over a BPSG comprising layer; and exposing the polysilicon to an aqueous solution comprising $NH_4F$, an oxidizer, $CH_3COOH$, TMAF within volumetric ranges of about 90–135: 70–280: 1.5–5.0: 0.17–0.53, respectively, under conditions effective to selectively etch at least a portion of the polysilicon comprising layer relative to an ultimately exposed portion of the BPSG comprising layer, the conditions comprising a temperature of from about 12° C. to about 32° C.

55. The method of claim 54 wherein the $NH_4F$, oxidizer, $CH_3COOH$, and TMAF are present in the solution within volumetric ranges of about 112–124: 105–245: 2.0–4.5: 0.26–0.44, respectively.

56. The method of claim 54 wherein the $NH_4F$, oxidizer, $CH_3COOH$, and TMAF are present in the solution within volumetric ranges of about 112.5: 175: 2.5: 0.35, respectively.

57. The method of claim 54 wherein the oxidizer comprises $H_2O_2$.

58. The method of claim 54 wherein the oxidizer comprises $HNO_3$.

59. The method of claim 54 wherein the oxidizer comprises $O_3$.

60. The method of claim 54 wherein the conditions comprise a temperature of from about 20° C. to about 24° C.

61. The method of claim 54 comprising conducting the exposing to selectively etch the polysilicon relative to the BPSG comprising layer at a ratio of at least 2.5:1.

62. The method of claim 54 comprising conducting the exposing to selectively etch the polysilicon relative to the BPSG comprising layer at a ratio of at least 2.7:1.

63. The method of claim 54 wherein the polysilicon is undoped.

64. The method of claim 54 wherein the polysilicon is doped.

65. The method of claim 41 wherein the aqueous solution consists essentially of $NH_4F$, oxidizer, $CH_3COOH$, and TMAF.

66. The method of claim 41 wherein the aqueous solution consists essentially of $NH_4F$, $H_2O_2$, $CH_3COOH$, and TMAF.

67. A method of selectively etching polysilicon relative to BPSG, comprising:

forming a substrate to have a layer comprising polysilicon received over a BPSG comprising layer; and exposing the polysilicon to an aqueous solution comprising $NH_4F$, $H_2O_2$, $CH_3COOH$, TMAH, and HF within volumetric ranges of about 112–124: 105–245: 2.0–4.5: 0.120–0.228: 0.22–0.28 respectively, under conditions effective to selectively etch at least a portion of the polysilicon comprising layer relative to an ultimately exposed portion of the BPSG comprising layer, the conditions comprising a temperature of from about 20° C. to about 24° C.

68. The method of claim 67 comprising conducting the exposing to selectively etch the polysilicon relative to the BPSG comprising layer at a ratio of at least 2.5:1.

69. The method of claim 67 comprising conducting the exposing to selectively etch the polysilicon relative to the BPSG comprising layer at a ratio of at least 2.7:1.

70. The method of claim 67 wherein the $NH_4F$, oxidizer, $CH_3COOH$, TMAH, and HF are present in the solution within volumetric ranges of about 112.5: 175: 2.5: 0.175: 0.2475, respectively.

71. The method of claim 67 wherein the polysilicon is undoped.

72. The method of claim 67 wherein the polysilicon is doped.

73. The method of claim 67 wherein the aqueous solution consists essentially of $NH_4F$, $H_2O_2$, $CH_3COOH$, TMAH, and HF.

74. A method of selectively etching polysilicon relative to BPSG comprising:

forming a substrate to have a layer comprising polysilicon received over a BPSG comprising layer; and exposing the polysilicon to an aqueous solution comprising $NH_4F$, an oxidizer, $CH_3COOH$, TMAF within volumetric ranges of about 90–135: 70–280: 1.5–5.0: 0.26–0.44, respectively, under conditions effective to selectively etch at least a portion of the polysilicon comprising layer relative to an ultimately exposed portion of the BPSG comprising layer, the conditions comprising a temperature of from about 20° C. to about 24° C.

75. The method of claim 74 wherein the $NH_4F$, oxidizer, $CH_3COOH$, and TMAF are present in the solution within volumetric ranges of about 112.5: 175: 2.5: 0.35, respectively.

76. The method of claim 74 comprising conducting the exposing to selectively etch the polysilicon relative to the BPSG comprising layer at a ratio of at least 2.5:1.

77. The method of claim 74 comprising conducting the exposing to selectively etch the polysilicon relative to the BPSG comprising layer at a ratio of at least 2.7:1.

78. The method of claim 74 wherein the polysilicon is undoped.

79. The method of claim 74 wherein the polysilicon is doped.

80. The method of claim 74 wherein the aqueous solution consists essentially of $NH_4F$, $H_2O_2$, $CH_3COOH$, and TMAF.

81. A method of selectively etching polysilicon relative to BPSG, comprising:

forming a substrate to have a layer comprising undoped polysilicon received over a BPSG comprising layer; and exposing the polysilicon to an aqueous solution comprising $NH_4F$, $H_2O_2$, $CH_3COOH$, TMAH, and HF within volumetric ranges of about 112–124: 105–245: 2.0–4.5: 0.120–0.228: 0.22–0.28 respectively, under conditions effective to selectively etch at least a portion of the undoped polysilicon comprising layer relative to an ultimately exposed portion of the BPSG comprising layer, the conditions comprising a temperature of from about 20° C. to about 24° C., and achieving selectivity of at least 2.5:1.

82. The method of claim 81 wherein the $NH_4F$, oxidizer, $CH_3COOH$, TMAH, and HF are present in the solution within volumetric ranges of about 112.5: 175: 2.5: 0.175: 0.2475, respectively.

83. The method of claim 81 comprising conducting the exposing to selectively etch the polysilicon relative to the BPSG comprising layer at a ratio of at least 2.7:1.

84. A method of selectively etching polysilicon relative to BPSG, comprising:

forming a substrate to have a layer comprising undoped polysilicon received over a BPSG comprising layer; and exposing the polysilicon to an aqueous solution comprising $NH_4F$, an oxidizer, $CH_3COOH$, TMAF within volumetric ranges of about 90–135: 70–280: 1.5–5.0: 0.26–0.44, respectively, under conditions effective to selectively etch at least a portion of the polysilicon comprising layer relative to an ultimately exposed portion of the BPSG comprising layer, the conditions comprising a temperature of from about 20° C. to about 24° C., and achieving selectivity of at least 2.5:1.

85. The method of claim 84 wherein the $NH_4F$, oxidizer, $CH_3COOH$, and TMAF are present in the solution within volumetric ranges of about 112.5: 175: 2.5: 0.35, respectively.

86. The method of claim 84 comprising conducting the exposing to selectively etch the polysilicon relative to the BPSG comprising layer at a ratio of at least 2.7:1.

* * * * *

UNITED STATES PATENT AND TRADEMARK OFFICE
CERTIFICATE OF CORRECTION

PATENT NO. : 6,306,775 B1
DATED : October 23, 2001
INVENTOR(S) : Andrew Li

It is certified that error appears in the above-identified patent and that said Letters Patent is hereby corrected as shown below:

<u>Column 5,</u>
Line 2, replace "0.26-044" with -- 0.26-0.44 --

<u>Column 6,</u>
Line 43, replace "effective to is selectively" with -- effective to selectively --

Signed and Sealed this

Second Day of April, 2002

Attest:

JAMES E. ROGAN
Attesting Officer     Director of the United States Patent and Trademark Office